United States Patent
Yamashita et al.

(10) Patent No.: US 6,816,017 B2
(45) Date of Patent: Nov. 9, 2004

(54) POWER AMPLIFIER MODULE

(75) Inventors: Kiichi Yamashita, Shiroyama (JP); Tomonori Tanoue, Machida (JP); Isao Ohbu, Sagamihara (JP); Kenji Sekine, Hinode (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/931,877

(22) Filed: Aug. 20, 2001

(65) Prior Publication Data

US 2002/0024390 A1 Feb. 28, 2002

(30) Foreign Application Priority Data

Aug. 31, 2000 (JP) ........................................ 2000-268368

(51) Int. Cl.$^7$ .............................................. H03F 1/52
(52) U.S. Cl. .................... 330/298; 330/207 P; 361/101; 455/117
(58) Field of Search ............................. 330/207 P, 298; 455/117; 361/30, 65, 79, 101; 415/117

(56) References Cited

U.S. PATENT DOCUMENTS

| | | | | | |
|---|---|---|---|---|---|
| 3,678,408 | A | * | 7/1972 | Suzuki | 330/298 |
| 3,786,364 | A | * | 1/1974 | Wheatley, Jr. | 330/298 |
| 3,967,207 | A | * | 6/1976 | Wheatley, Jr. | 330/309 |
| 4,061,983 | A | * | 12/1977 | Suzuki | 330/207 P |
| 4,074,334 | A | * | 2/1978 | D'Arrigo et al. | 361/79 |
| 4,321,648 | A | * | 3/1982 | Kaplan | 361/101 |
| 4,355,341 | A | * | 10/1982 | Kaplan | 361/79 |
| 4,413,300 | A | * | 11/1983 | Sumi et al. | 361/98 |
| 4,789,842 | A | * | 12/1988 | Naxera | 330/298 |
| 4,870,533 | A | * | 9/1989 | Bahlmann | 361/101 |
| 5,343,141 | A | * | 8/1994 | Metro et al. | 323/288 |
| 5,357,089 | A | * | 10/1994 | Prentice | 330/298 |
| 5,404,114 | A | * | 4/1995 | Sager | 330/207 P |
| 5,917,382 | A | * | 6/1999 | Chiozzi | 330/298 |
| 6,137,366 | A | * | 10/2000 | King | 330/298 |
| 6,300,837 | B1 | * | 10/2001 | Sowlati et al. | 330/296 |
| 6,329,879 | B1 | * | 12/2001 | Maruyama et al. | 330/289 |

FOREIGN PATENT DOCUMENTS

| | | |
|---|---|---|
| JP | 49-53359 | 5/1974 |
| JP | 2-135809 | 5/1990 |
| JP | 7-263977 | 10/1995 |
| JP | 2000-209038 | 7/2000 |
| TW | 354205 | 3/1999 |

\* cited by examiner

Primary Examiner—Michael Tokar
Assistant Examiner—Nguyen Khai
(74) Attorney, Agent, or Firm—Miles & Stockbridge P.C.

(57) ABSTRACT

A power amplifier module is provided with a function of protecting an amplifying device against destruction caused by a standing wave by reflection from an antenna end in load variation. Increase in base current from idling current of a final stage amplifying portion GaAs-HBT in load variation is detected and canceled and collector current is restrained to thereby prevent an increase in output and prevent destruction of GaAs-RET. By also using a function of successively lowering idling current when power source voltage is elevated and a clipping function of diodes connected in parallel with output stage GaAs-RET, voltage as well as current more than necessary are avoided from being applied on the output stage GaAs-RET.

12 Claims, 6 Drawing Sheets

POWER AMPLIFIER MODULE

BACKGROUND OF THE INVENTION

1. Field of the Invention

The present invention relates to a power amplifier module for a portable terminal used in a mobile communication system, particularly to a power amplifier module for a cellular telephone system requesting a high tolerance level of device destruction against significant load impedance fluctuation.

2. Description of the Related Art

In recent years, expansion of a mobile communication market represented by a cellular telephone system is remarkable and higher efficiency formation of a portable terminal has been requested in aiming at enlargement of speech time period. In order to realize the request, among parts constituting a portable terminal, it is indispensable to achieve low power consumption formation, that is, high efficiency formation of a power amplifier requesting the largest power consumption. Meanwhile, when a portable terminal is used, there frequently causes destruction of an antenna constituting a load of the power amplifier module or contact of antenna with metal. In such an occasion, a condition of matching the power amplifier module and the antenna is destructed and therefore, a large standing wave is formed by power reflection and the power amplifier module is liable to destruct. Therefore, a large tolerance level of device destruction is requested for an amplifying device constituting the power amplifier. Although currently, as an amplifying device of a power amplifier, Si-MOSFET having a large tolerance level of device destruction is mainly reduced into practice, in recent years, development of a power amplifier constituting an amplifying device by GaAs-HBT (Heterojunction Bipolar Transistor) capable of achieving high efficiency more than Si-MOSFET has actively been promoted. However, a tolerance level of device destruction of GaAs-HBT is smaller than that of Si-MOSFET and for reduction into practice, protection against device destruction in load impedance fluctuation becomes an indispensable problem. Conventionally, according to a power amplifier using an Si transistor, as disclosed in Japanese Patent Laid-Open No. 135809/1990, in order to avoid destruction of an amplifying device caused by shortcircuit of load or the like, there have been carried out many trials for inserting a circuit for detecting overcurrent on the emitter side or the collector side of a power amplifying element.

However, the method of inserting the circuit for detecting overcurrent to the emitter side or the collector side of the power amplifying element, causes power loss and gives rise to lowering of efficiency and therefore, the method is not suitable for a power amplifier for a cellular telephone system requesting high efficiency. Meanwhile, there is hardly seen an example of protection against device destruction of a power amplifier using GaAs-HBT as an amplifying device. As a representative example, there is conceived a method of supplying base current of GaAs-HBT from a current source and setting the base current to reduce when power supply voltage is elevated to thereby prevent destruction by restraining rise of output power.

FIG. 3A shows a final stage amplifier portion of the conventional example. Numerals 1 and 2 respectively designate an input and an output terminal, numeral 3 designates GaAs-HBT, numerals 4 and 5 designate matching circuits, numerals 6 and 7 designate bias resistors, numeral 8 designates a high frequency choke inductor, numeral 9 designates an output control terminal, numeral 10 designates a current source, numeral 11 designates a power supply voltage detecting circuit and numeral 12 designates a power supply voltage terminal. In FIG. 3A, an operating point of GaAs-HBT3 is determined by idling current (collector current when there is not a signal). Therefore, in order to set the operating point, base current in a unique relationship with the idling current may be set to a required value. From such reason, according to the conventional example of FIG. 3A, there is constructed a constitution of supplying the base current from the current source 10. Further, when output control voltage exceeds a predetermined value, the power supply voltage detecting circuit 11 is operated and the idling current is maintained constant by restricting the output control voltage applied to the current source 10. The value of the idling current is set in accordance with power supply voltage and the higher the power supply voltage, the smaller the idling current. FIG. 3B shows a relationship between output power and power supply voltage when the output control voltage in the above-described conventional example is 2.2V. It has been found by experiment by the inventors that the output voltage shows a reducing tendency when the power source voltage is equal to or higher than 3.7 through 4V. This reflects a result that the idling current is controlled to reduce in accordance with rise of the power supply voltage.

Further, according to the above-described conventional example, as shown by FIG. 3B, temperature dependency of the output voltage is significant. This is because the base current of GaAs-HBT3 is supplied from the current source, whereby not only the current amplification rate of GaAs-HBT3 and temperature variation of the current source but also production deviation are liable to be influenced thereby and it is difficult to realize high product yield.

It is an object of the invention to resolve the above-described problem of the conventional technology and provide a power amplifier module at a low cost having high efficiency and high tolerance level of device destruction and strong at production deviation and temperature variation of GaAs-HBT and the base current supply source.

It is other object of the invention to protect a power amplifier module against destruction with regard to a wide range of phase change in load variation by detecting, canceling or restricting overcurrent flowing at the base of the final stage amplifier GaAs-HBT produced in load variation.

It is other object of the invention to achieve further promotion of a tolerance level of device destruction of GaAs-HBT by also using a function of successively lowering idling current in accordance with power source voltage or clipping function of a diode in addition to a constitution of detecting, canceling or restricting the overcurrent.

It is other object of the invention to be able to carry out stable high-quality signal transmitting operation in a mobile communicator even when a user erroneously destructs an antenna or the like or brings the antenna into contact with a metal or the like.

It is other object of the invention to provide a power amplifier module having insignificant influence of the current amplification rate of GaAs-HBT on the production deviation or the temperature variation, providing high production yield and capable of contributing to low cost formation.

The above-described and other objects and novel characteristics of the invention will become apparent from the description and the attached drawings of the specification.

SUMMARY OF THE INVENTION

An explanation will be given of outlines of representative aspects of the invention disclosed in the application as follows.

That is, in order to achieve the above-described object, the invention provides means in which required output power can be ensured when a power amplifier is operated in steady state (for example, 50Ω load), further, when load variation or power supply voltage rise is caused, in order to prevent base current in a bipolar transistor constituting a power amplifier element from flowing more than necessary, in the case in which an amount of overcurrent is produced by exceeding a previously set current value, the amount of overcurrent is detected and is negatively fed back to base current (idling current) supplied to the power amplifier element and the amount of overcurrent is subtracted from initial idling current to thereby prevent destruction of the power amplifier element while ensuring required output power. Here, although as the bipolar transistor constituting the power amplifier element, GaAs-HBT can be used, the bipolar transistor is not limited thereto but other kind of bipolar transistor such as SiGe-HBT or the like may be used.

When the power amplifier is operated in a steady state, a set value for detecting the amount of overcurrent is set to a value slightly higher than the base current necessary for providing required output current. This is for preventing a protecting circuit from being brought into an operating state erroneously in the steady state. For such purpose, the protecting circuit for detecting the amount of overcurrent and negatively feeding the amount of overcurrent back to the idling current, is brought into a standstill state and when the load variation or the power supply voltage rise is caused, the current is increased and when the current exceeds the set value, the protecting current starts operating and the excess amount of the base current is canceled. A voltage source is used for supplying the base current of the final stage amplifier GaAs-HBT.

Although it is preferable to use a bipolar transistor for a transistor constituting the protecting circuit, the transistor is not limited thereto but Si-MOSFET may also be used.

DETAILED DESCRIPTION OF THE PREFERRED EMBODIMENTS

Figure 1:
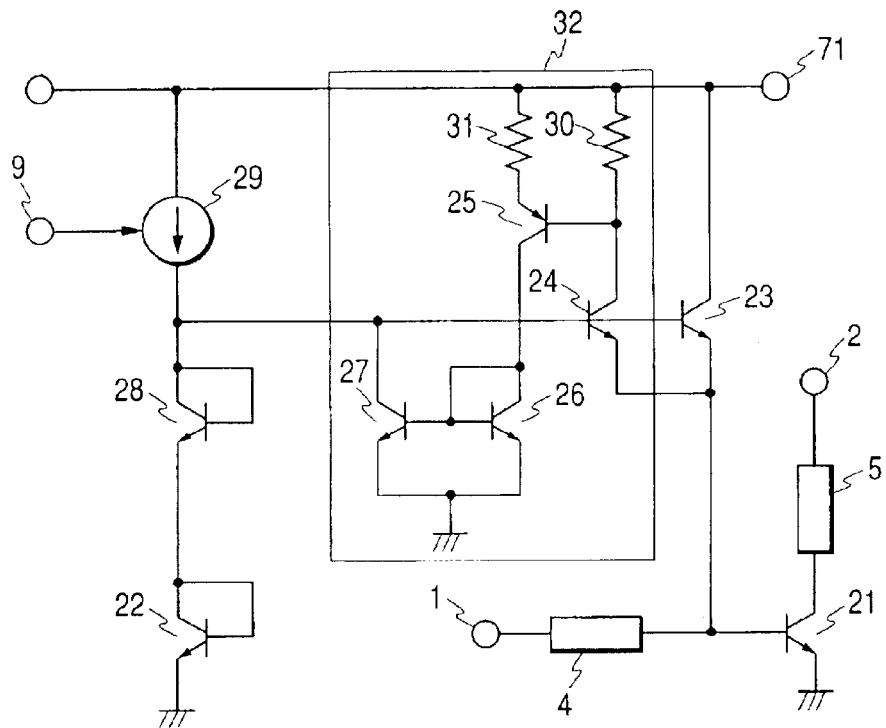
FIG. 1 is a diagram showing a basic embodiment of the invention.
Figure 2:
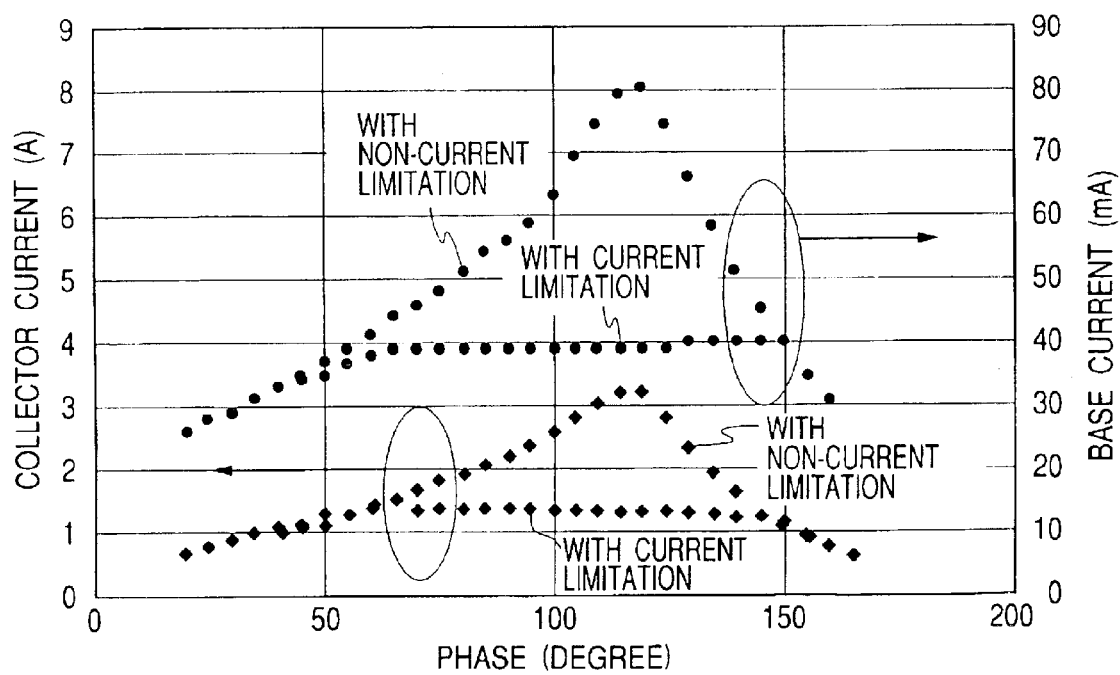
FIG. 2 is a diagram for explaining operation principle of the basic embodiment of the invention.
Figure 3A:
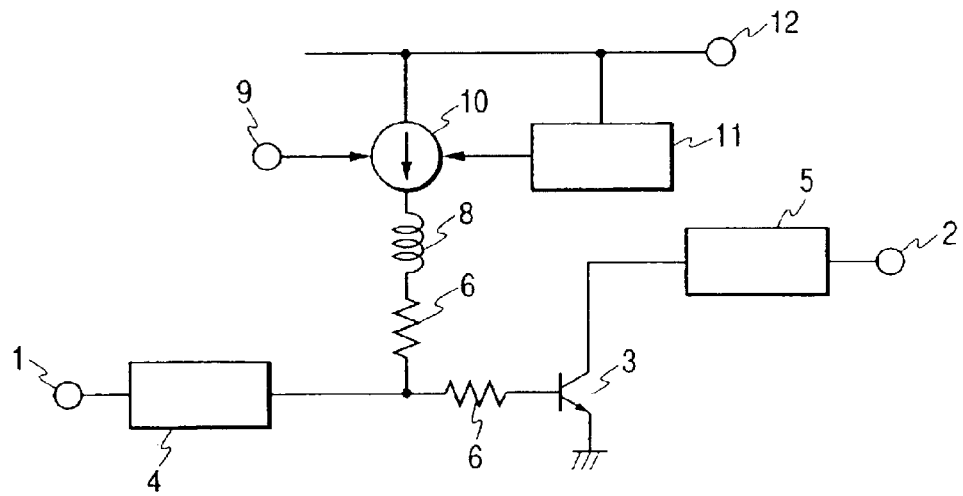
FIG. 3A and FIG. 3B are diagrams showing an example of a conventional technology.
Figure 3B:
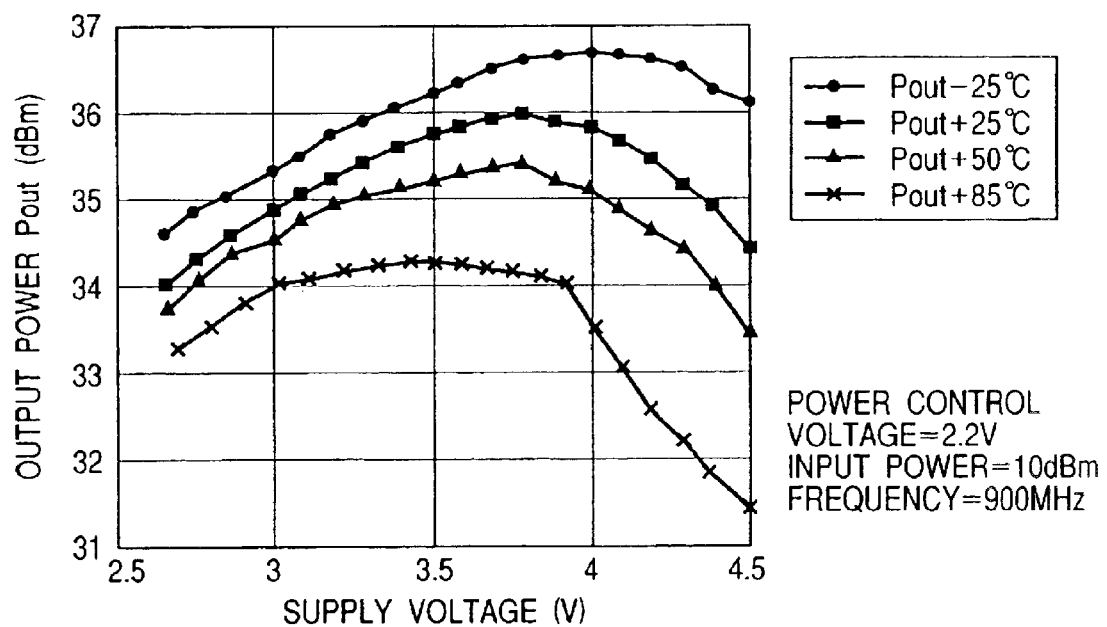
Figure 10:
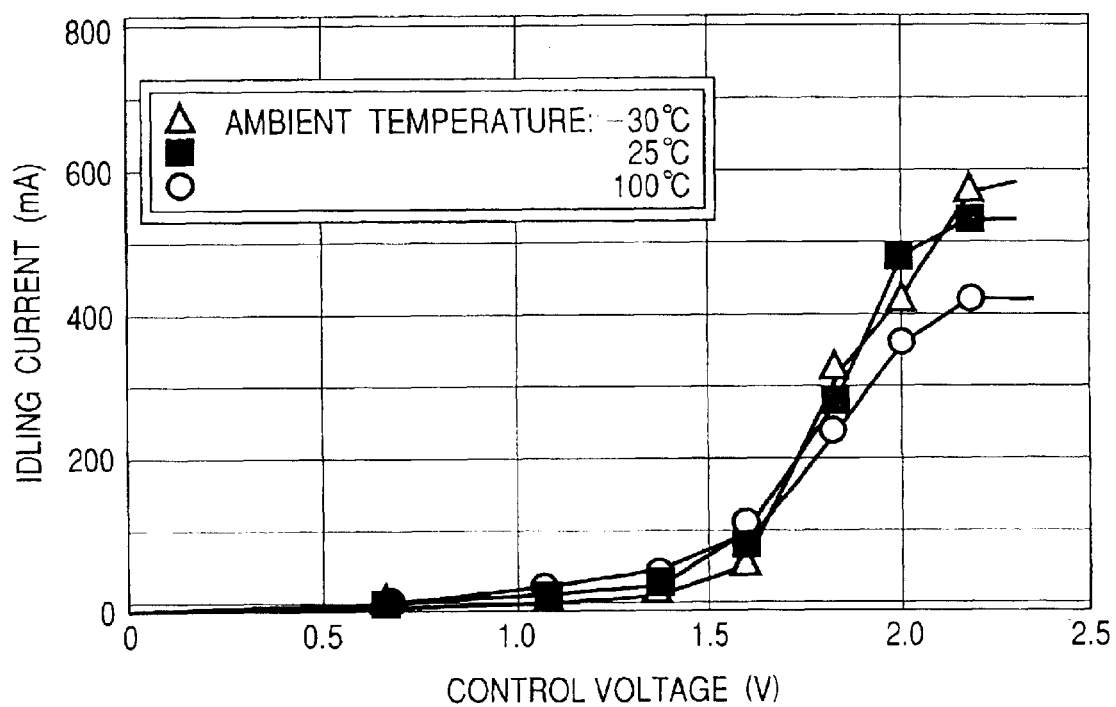
FIG. 10 is a diagram showing an evaluation result of the basic embodiment of the invention.

A power amplifier module is generally constituted by two stages or three stages of unit amplifiers. FIG. 1 shows an embodiment of a power amplifier module according to the invention. The embodiment shows a final stage amplifying portion which mostly needs protection against device destruction and is constituted by a signal amplifying system comprising GaAs-HBT 21 and matching circuits 4 and 5, a bias system comprising transistors 23, 24 and 28 and GaAs-HBT 22 and a protecting circuit 32 comprising transistors 24–27 and resistors 30 and 31. A signal inputted from a terminal 1 is subjected to power amplification by GaAs-HBT 21 via the matching circuit and is outletted to a terminal 2 via the matching circuit 4. Here, a set of GaAs-HBT 21 and the transistors 23 and 24 and a set of the transistor 28 (diode connection) and GaAs-HBT 22 constitute a current mirror and at GaAs-HBT 21, there flows idling current supplied from a current source 29 multiplied by a mirror ratio. Next, an explanation will be given of principle of operation of protection against device destruction. When the signal is inputted, GaAs-HBT 21 starts amplifying operation with idling current as an onset. At this moment, when a signal level is large, GaAs-HBT 21 carries out nonlinear operation and therefore, self-bias current flows at the base. Under the operational state, the self-bias current flows as base current and becomes current larger than base current in correspondence with the idling current (when there is not an input). The idling current is determined by current supplied from the current source and the current mirror circuit and therefore, an amount of increase by the self-bias flows at the transistors 23 and 24. The transistor 24 is used for detecting overcurrent and distributes base current. The distributed current produces voltage drop at the resistor 30 and when the voltage drop of the resistor exceeds turn-on voltage (voltage between base and emitter) of the transistor 25, the protecting circuit 32 starts operating. Therefore, a value of the resistor 30 is determined by the turn-on voltage of the transistor 25 and a previously set distributed current value. Actually, the resistor value is set to be able to permit a current value slightly higher than the base current (self-bias current) necessary for providing output power requested in a steady state. This is for preventing the protecting current from being erroneously brought into an operational state in the steady state. Here, the steady state is a state in which regular impedance inherently provided to a load such as antenna is applied as a load of a power amplifier and in the case of a portable telephone, the load is, for example, 50Ω. At this moment, the protecting circuit is brought into a standstill state. Consider a case in which load variation is caused under such a state. When the load variation is caused, a large standing wave is formed at the output terminal 2 by reflection from an end of antenna and large collector current flows depending on the phase of reflected wave. In correspondence therewith, the base current is also increased. The behavior is shown by FIG. 2. Collector current and base current in load variation are maximized when the phase of the reflection wave is at a vicinity of 120 degree and the base current is increased by as much as about 80 mA. The base current in the steady state with 50Ω load is 30–35 mA and therefore, the base current becomes twice or more as much as that in the steady state and constitutes cause of destruction. Protecting operation in load variation is carried out as follows. When load variation is caused, overcurrent flows at the base of GaAs-HBT 21 in comparison with the base current at 50Ω load. The current is distributed at the transistor 24 and is taken out as voltage by the resistor 30. When the voltage drop of the resistor 30 exceeds the turn-on voltage of the transistor 25, the transistor is started and detection current is made to flow to the transistor 26 (diode connection). Here, the transistors 26 and 27 constitute a current mirror and therefore, at the transistor 27, there flows current multiplied by the mirror ratio. Therefore, when an amount of the detection current is substracted from current supplied from the current source 29, an excess amount of the base current of GaAs-HBT 21 can be canceled. FIG. 2 is an example in which a restricted value of the base current is set to 40 mA such that in the steady state (50Ω load), output power of 35.5 dBm is provided. When the base current equal to or larger than the restricted value flows, the protecting circuit 32 is operated and cancels overcurrent, thereby, the base current is restricted to a constant value 40 mA, an increase in the collector current is prevented and destruction is prevented. Further, when the circuit of FIG. 1 is trial constructed and evaluated, as shown by FIG. 10, it is known that a variation of idling current by temperature at temperatures of −30, 25 and 100° C., is as small as 5–6%. This is because with regard to the base current of GaAs-HBT 21, the transistors 23 and 24 operate as emitter followers and the temperature dependency of the current amplification rate of GaAs-HBT 21 can be absorbed. Further, in FIG. 1, GaAs-HBT 21 and 22 may be integrated to a single chip, further, the other transistors and resistors may be integrated to a single chip and the latter may be constituted by Si transistor or SiGe-HBT. Further, GaAs-HBT 21 and 22 may be replaced by SiGe-HBT and constituted by a single chip.

Figure 4:
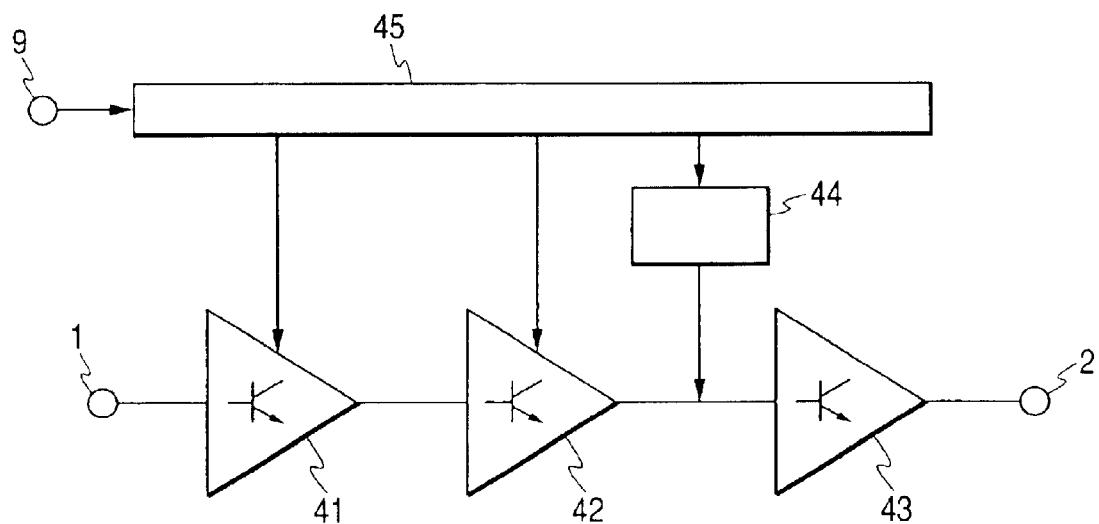
FIG. 4 is a diagram showing an embodiment of the invention.

FIG. 4 shows an embodiment of the invention with regard to a three-stage power amplifier module in which all of amplifying portions 41, 42 and 43 are constituted by GaAs-HBT or SiGe-HBT. A signal inputted from the terminal 1 is subjected to power amplification respectively by the initial stage amplifying portion 41, the intermediary stage amplifying portion 42 and the final stage amplifying portion 43 and is outputted from the terminal 2. Although idling current of the amplifying portions 41, 42 and 43 is supplied by a bias circuit 45 having a current mirror constitution similar to that in FIG. 1, particularly with regard to the final stage amplifying portion 43, the idling current is given thereto via a protecting circuit 44 having a function of restricting base current. Output power is adjusted by controlling respective power gains of the amplifying portions 41, 42 and 43 in accordance with output power control voltage inputted from a terminal 9. According to the constitution, the final stage amplifying portion 43 connected to loads of a combiner for power detection, an antenna switch, an antenna and so on, is mostly liable to undergo the influence of load variation and the influence of load variation is difficult to effect to the initial stage amplifier portion 41 and intermediary stage amplifying portion 42 since the final stage amplifying portion 43 operates as a buffer. Therefore, the protecting circuit 44 is provided to the final stage amplifying portion 43 to thereby prevent destruction of the amplifying device by the load variation. However, the initial stage amplifying portion 41 or the intermediary stage amplifying portion 42 may be provided with protecting circuits similar to the protecting circuit 44. It is necessary to provide the protecting circuit 44 at least to the final stage amplifying portion 43. Device protecting operation against load variation of the protecting circuit 44 is the same as that in the case of FIG. 1 and therefore, an explanation thereof will be omitted here. Further, with regard to amplifying devices of the amplifying portions 41 and 42, even when at least one of them uses Si-MOSFET, the same amplifying and protecting functions are achieved.

Figure 5:
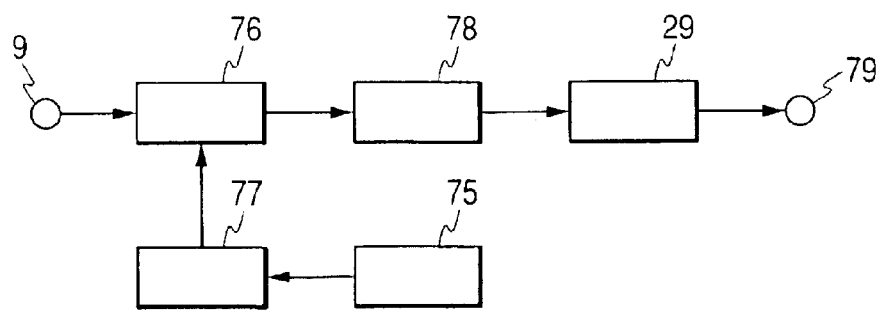
FIG. 5 is a diagram showing other embodiment of the invention.

FIG. 5 shows a specific example a bias circuit according to the invention in which output current of the current source 29 in FIG. 1 can be controlled by power supply voltage. Output power of a power amplifier is generally increased with an increase in power supply voltage. Therefore, when load variation is excited in the case in which high power supply voltage is applied, reflection voltage three to four times as much as power supply voltage is applied to an amplifying device of a final stage and therefore, the amplifying device is liable to destruct. The embodiment of FIG. 5 is constituted to prevent destruction by restraining output power by successively lowering idling current of the amplifying portion shown by FIG. 1 or FIG. 4 by an increase in power supply voltage in order to further promote the function of protection against device destruction. In FIG. 5, output control voltage inputted from the terminal 9 is converted into current by a voltage-current conversion circuit 76 and is converted into voltage after setting a predetermined slope by an adjusting circuit 78 for power control slope. Output current of a current source 29 is controlled by the voltage and is outputted from a terminal 79 to, for example, GaAs-HBT 22 or the like of FIG. 1. Meanwhile, power supply voltage is detected by a power supply voltage detecting circuit 75 and thereafter inputted to a current control circuit 77. The current control circuit 77 is provided with a function of making output current of the voltage-current conversion circuit 76 constant when the output current exceeds a previously set value in accordance with power supply voltage, with regard to the output control voltage or higher. Here, the output current is set to successively lower when the power supply voltage is increased. According to a series of above-described operation, the idling current supplied to the respective amplifying portion is proportional to the output current and therefore, output of the amplifying portion can successively be lowered when the power supply voltage is increased.

Figure 6:
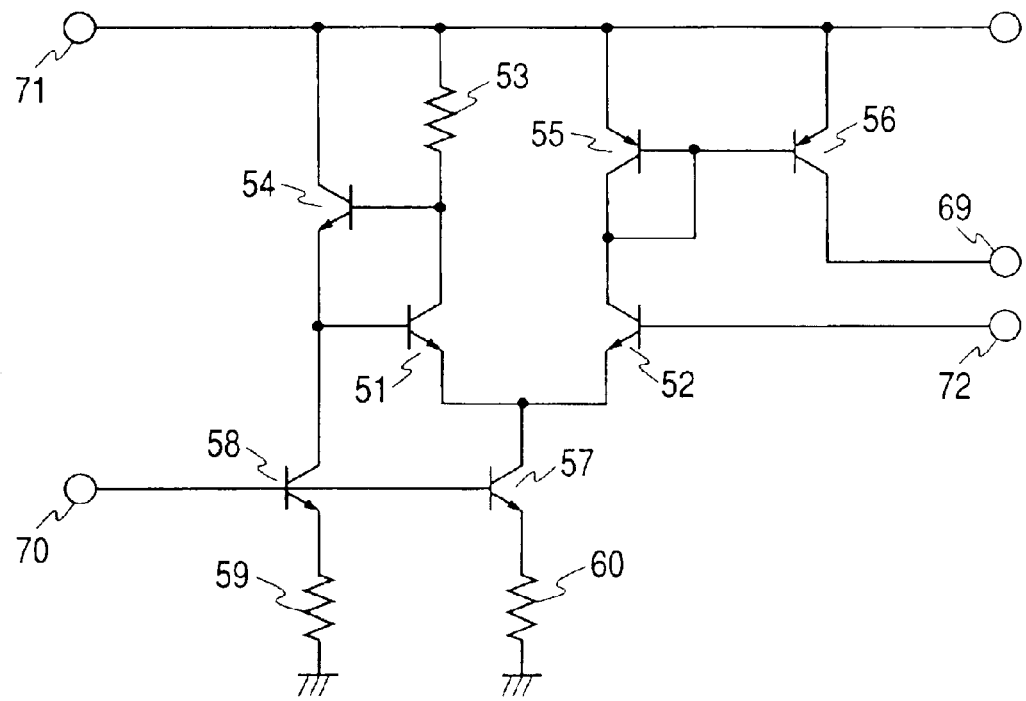
FIG. 6 is a diagram showing a specific example of a power supply voltage detecting circuit according to the invention.

FIG. 6 shows an embodiment of a specific circuit of the power supply voltage detecting circuit 75. A transistor 58 and a resistor 59, and a transistor 57 and a resistor 60 respectively constitute constant current sources, the former supplies current to a transistor 54 and latter supplies current to a differential amplifier comprising transistors 51 and 52. Numeral 70 designates a voltage terminal for controlling current values of the constant current sources constituted by the transistor 58 and the resistor 59, and the transistor 57 and the resistor 60. Next, a description will be given of principle of detecting power supply voltage. When power supply voltage applied to a terminal 71 is varied, collector voltage of the transistor 51 is changed in accordance therewith. The voltage variation is fed back to the base of the transistor 51 via the transistor 54 and current supplied from the transistor 57 is redistributed such that the base voltage coincides with reference voltage of a terminal 72. That is, the circuit is operated such that the base voltage of the transistor 51 always coincides with the reference voltage of the terminal 72 and accordingly, a change in voltage applied to a resistor 53 becomes equal to the variation of the power supply voltage. Therefore, current flowing in the transistor 52 can be determined when the change in the voltage applied to the resistor 53 is divided by a resistance value thereof. According to the example of FIG. 6, the current flowing in the transistor 52 is reduced when the power supply voltage is increased and the current value can arbitrarily be set by changing the value of the resistor 53. Here, transistors 55 and 56 are for polarity inversion and constitute a current mirror. The detected power supply voltage is converted into a current value and is outputted from a terminal 69 for outputting detection current.

Figure 7:
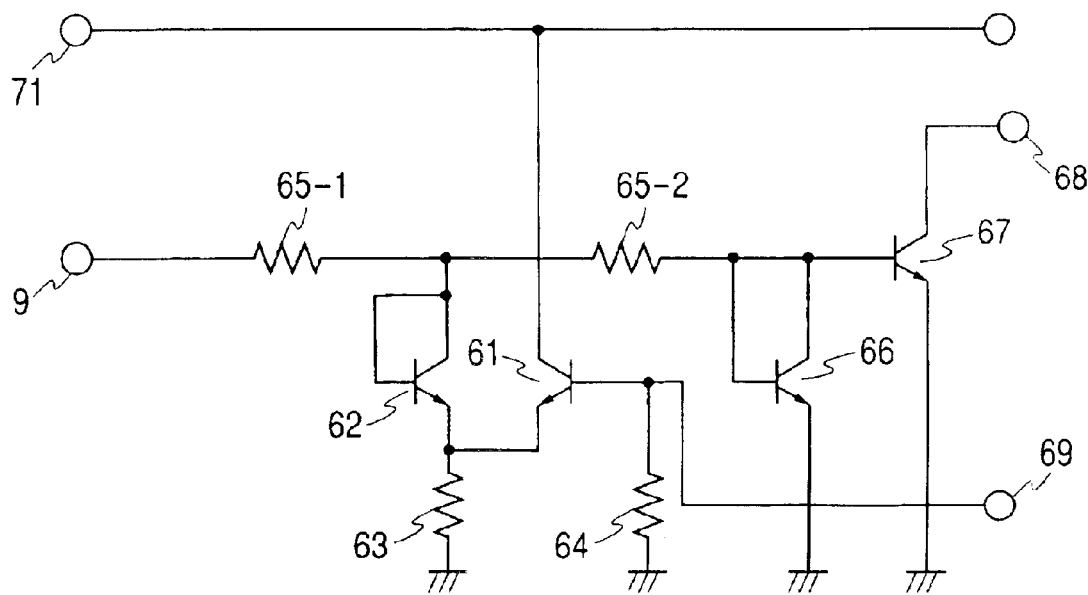
FIG. 7 is a diagram showing a specific example of a current restricting circuit according to the invention.

FIG. 7 shows a specific example of the current control circuit 77 and the voltage-current conversion circuit 76. Current supplied from the transistor 56 of FIG. 6 via the terminal 69 for outputting detection current, is converted into voltage by a resistor 64. When the voltage is elevated, a transistor 61 is shifted from a standstill state to an operational state and the emitter voltage is elevated in proportion to voltage across both ends of the resistor 64. The emitter voltage of the transistor 61 is subjected to level transform by a transistor 62 (diode connection) and changes potential of a connection point 80 for connecting resistors 65-1, 65-2. Therefore, when the potential is set to a predetermined value in accordance with the power supply voltage, with regard to output control voltage equal to or higher than the value, current flowing in transistors 66 and 67 for executing voltage-current conversion can be restricted to be constant.

Figure 8:
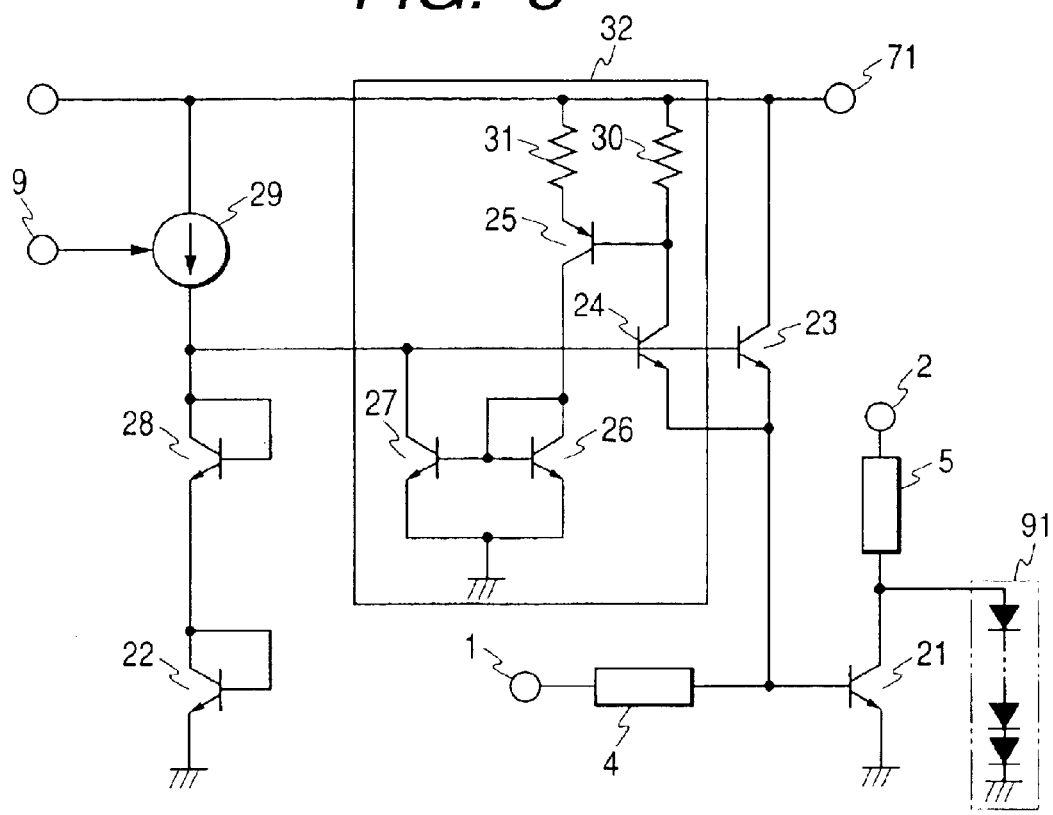
FIG. 8 is a diagram showing other embodiment of the invention.

FIG. 8 shows other embodiment for further promoting a function of preventing destruction of an amplifying device in variation of load. According to the embodiment, GaAs-HBT 21 of FIG. 1 is connected in parallel with a diode group 91 in which large current can flow for conducting voltage equal to or higher than a predetermined value and preventing destruction by clipping operation of the diodes. In variation of load, voltage near to 20V is applied as collector voltage of GaAs-HBT at a final stage amplifying portion. When such high voltage is applied on the collector, destruction is caused by avalanche breakdown. The diode group connected in parallel with GaAs-HBT 21 restricts such high voltage and accordingly, large current capacity is needed. According to a portable telephone terminal for mobile communication, the clipping voltage of diode is frequently set to a vicinity of 10V.

Figure 9:
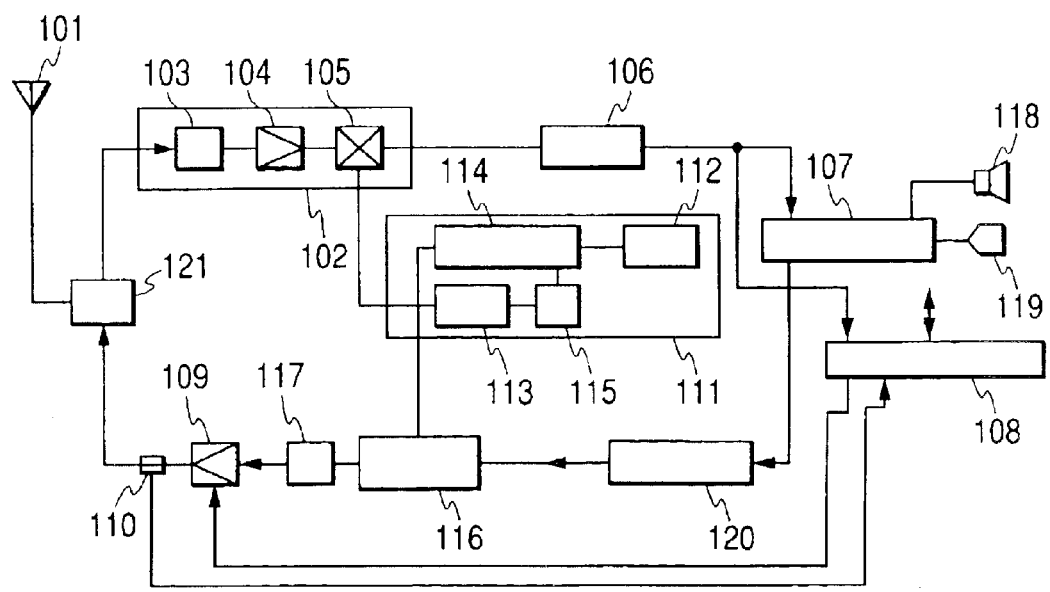
FIG. 9 is a diagram showing other embodiment of the invention.

FIG. 9 shows a total block diagram of an embodiment of a mobile communicator using the power amplifier module according to the invention. The most representative example of the mobile communicator is a portable telephone as described above. A received signal received by an antenna 101 is amplified at a receiving front end 102 constituted by a filter 103, an amplifier 104 and a mixer 105, converted into an intermediate frequency wave by the mixer 105 and is transmitted to a voice processing circuit 107 via an intermediate signal processing circuit IF-IC 106. A gain control signal periodically included in the receive signal is decoded at a microprocessor CPU 108, although not particularly limited, where input control voltage supplied to the power amplifier module 109 is formed. In the power amplifier module 109, gain control is carried out in accordance with the input control voltage and a transmitted output signal is formed. A portion of the transmitted power is fed back to the microprocessor CPU 108 via a filter 117 and a power combiner 110 or the like and the above-described designated power control is carried out. At a frequency synthesizer 111, an oscillated signal in correspondence with a received frequency is formed by a reference oscillating circuit TCXO 112, a voltage control oscillating circuit VCO 113 and PLL-IC 114 and a filter 115 and is transmitted to the mixer 105 of the receiving front end 102 on one side. The oscillated signal is supplied to a modulator 116 on the other side. At the voice processing circuit 107, the received signal drives a receiver 118 to thereby output a voice signal. Transmitted voice is converted into an electric signal by a microphone 119 and is transmitted to the modulator 116 via the voice processing circuit 107 and a modulator and de-modulator 120. Further, numeral 121 designates an antenna switch for switching a terminal to a transmitted or received state.

According to such a mobile communicator, when the mobile communicator is used, the antenna 101 constituting load of the power amplifier module 109 is frequently destructed or is brought into contact with a low impedance material such as a metal and therefore, the matching condition between the power amplifier module 109 and the antenna 101, is destructed or in so-to-speak load variation, large standing wave is erected by power reflection and the power amplifier module 109 is liable to destruct. Therefore, a high tolerance level of device destruction is requested for a key device constituting the power amplifier. According to the power amplifier module 109 of the invention, overcurrent flowing in the base of the final stage amplifier GaAs-HBT produced in load variation can be restricted and therefore, the power amplifier module 109 can be protected against destruction in a wide range of phase change in load variation and the power amplifier module 109 can be used without causing a drawback in transmitting a signal of the mobile communicator.

As has been explained above, according to the constitution of the invention, overcurrent flowing in the base of the final stage amplifier GaAs-HBT caused in load variation, can be restricted by detecting and canceling the overcurrent and accordingly, the power amplifier module can be protected against destruction with regard to a wide range of phase change in load variation. Further, by also using the function of successively lowering idling current in accordance with power supply voltage and the clipping function of diode, further promotion of the tolerance level of device destruction of GaAs-HBT can be expected. Therefore, even when a user erroneously destructs the antenna or brings the antenna into contact with a metal or the like, stable and high-quality signal transmitting operation can be carried out in a mobile communicator. Further, since the voltage source is used for supplying the base current of the final stage amplifier GaAs-HBT, the influence of the current amplification rate of GaAs-HBT on the production deviation or the temperature variation is inconsiderable and high production yield is provided, which accordingly contribute to low cost formation.

What is claimed is:

1. A power amplifier module comprising:

a signal amplifying portion including at least a bipolar transistor as an amplifying element and amplifying and outputting an input signal;

a bias circuit for providing an idling current to the signal amplifying portion;

a protecting circuit constituted such that when a forward base current of the bipolar transistor exceeds a predetermined value, a current having an amount of exceeding the predetermined value flows from the bias circuit to the protecting circuit;

a voltage to current conversion circuit for inputting an output control voltage, converting the output control voltage into a current and controlling an output current of a current source;

a power supply voltage detecting circuit for detecting a power supply voltage and converting the power supply voltage into a current and outputting the current; and a current control circuit for inputting an output current of the power supply voltage detecting circuit, converting the output current into a voltage and controlling the voltage to current conversion circuit such that when the voltage is larger than a predetermined voltage, the output current of the voltage to current conversion circuit becomes substantially constant with regard to an input of the output control voltage equal to or higher than the voltage, wherein by making the amount of exceeding the predetermined value of the base current flow to the protecting circuit, an output of the signal amplifying portion is restricted to be equal to or smaller than a predetermined value, and wherein the predetermined value of the base current is made variable in accordance with a change in a power supply voltage.

2. The power amplifier module according to claim 1, wherein the signal amplifying portion includes a matching circuit and the bipolar transistor constitutes a portion of a current mirror circuit.

3. The power amplifier module according to claim 1, wherein the bias circuit includes a current source and a transistor and the transistor constitutes a current mirror circuit along with another transistor connected in series with the current source.

4. The power amplifier module according to claim 1, wherein the protecting circuit includes a first transistor, a first resistor connected to a base of the first transistor, a second resistor one end of which is connected to an emitter of the first transistor and another end of which is connected to the first resistor, a second transistor connected to a collector of the first transistor and a third transistor constituting a current mirror circuit along with the second transistor and connected to the bias circuit.

5. The power amplifier module according to claim 1, further comprising:

diodes for clipping voltage connected in multiple stages in parallel with the amplifying element.

6. The power amplifier module according to claim 1, wherein the amplifying element is constituted by GaAs-HBT or SiGe-HBT and the protecting circuit includes an Si-bipolar transistor or SiGe-HBT.

7. The power amplifier module according to claim 1, wherein the amplifying element and protecting circuit are constituted by SiGe-HBT or an Si-bipolar transistor and are integrated into a single chip.

8. The power amplifier module according to claim 1, further comprising:

a plurality of stages of the amplifying elements connected in series with each other, wherein at least the amplifying element at a final stage is protected by the protecting circuit.

9. The power amplifier module according to claim 8, wherein the final stage amplifying element is constituted by GaAs-HBT and at least one of an initial stage or an intermediary stage amplifying element is constituted by Si-MOSFET.

10. The power amplifier module according to claim 8, wherein the final stage amplifying element is constituted by GaAs-HBT and the amplifying element at an initial stage or at least a portion of the protecting circuit is constituted by a Si-MOSFET.

11. A wireless communication apparatus having a power amplifier module comprising:

a signal amplifying portion including at least a bipolar transistor as an amplifying element and amplifying and outputting an input signal;

a bias circuit for providing an idling current to the signal amplifying portion;

a protecting circuit constituted such that when a forward base current of the bipolar transistor exceeds a predetermined value, a current having an amount of exceeding the predetermined value flows from the bias circuit to the protecting circuit;

a voltage to current conversion circuit for inputting an output control voltage, converting the output control voltage into a current and controlling an output current of a current source;

a power supply voltage detecting circuit for detecting a power supply voltage and converting the power supply voltage into a current and outputting the current; and a current control circuit for inputting an output current of the power supply voltage detecting circuit, converting the output current into a voltage and controlling the voltage to current conversion circuit such that when the voltage is larger than a predetermined voltage, the output current of the voltage to current conversion circuit becomes substantially constant with regard to an input of the output control voltage equal to or higher than the voltage, wherein by making the amount of exceeding the predetermined value of the base current flow to the protecting circuit, an output of the signal amplifying portion is restricted to be equal to or smaller than a predetermined value, wherein the predetermined value of the base current is made variable in accordance with a change in a power supply voltage, and wherein a voice signal is modulated, the modulated voice signal is amplified by the power amplifier module and a modulated signal is outputted via an antenna.

12. A wireless communication apparatus according to claim 11, further comprising:

an antenna; a receiving front end portion; a frequency synthesizer; a voice processing portion; and a modulator and de-modulator.

* * * * *